United States Patent
Sun et al.

(10) Patent No.: US 12,543,426 B2
(45) Date of Patent: Feb. 3, 2026

(54) ORGANIC LIGHT EMITTING DEVICE AND DISPLAY APPARATUS

(71) Applicant: BOE Technology Group Co., Ltd., Beijing (CN)

(72) Inventors: Haiyan Sun, Beijing (CN); Meishan Xu, Beijing (CN); Dan Wang, Beijing (CN); Changho Lee, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1001 days.

(21) Appl. No.: 17/419,306

(22) PCT Filed: Sep. 28, 2020

(86) PCT No.: PCT/CN2020/118587
§ 371 (c)(1),
(2) Date: Jun. 29, 2021

(87) PCT Pub. No.: WO2022/061938
PCT Pub. Date: Mar. 31, 2022

(65) Prior Publication Data
US 2022/0310920 A1  Sep. 29, 2022

(51) Int. Cl.
| | |
|---|---|
| H01L 51/00 | (2006.01) |
| H10K 50/11 | (2023.01) |
| H10K 85/60 | (2023.01) |
| H10K 50/15 | (2023.01) |
| H10K 50/17 | (2023.01) |
| H10K 101/30 | (2023.01) |

(52) U.S. Cl.
CPC ........... *H10K 50/11* (2023.02); *H10K 85/622* (2023.02); *H10K 85/633* (2023.02); *H10K 50/15* (2023.02); *H10K 50/17* (2023.02); *H10K 2101/30* (2023.02)

(58) Field of Classification Search
CPC .... H10K 85/633; H10K 85/622; H10K 50/15; H10K 50/17; H10K 2101/30
See application file for complete search history.

(56) References Cited

U.S. PATENT DOCUMENTS

| | | | |
|---|---|---|---|
| 2002/0197511 A1* | 12/2002 | D'Andrade | H10K 50/125 313/506 |
| 2004/0217693 A1* | 11/2004 | Duggal | H10K 50/18 313/504 |
| 2004/0265630 A1 | 12/2004 | Suh et al. | |
| 2006/0159957 A1* | 7/2006 | Yabunouchi | C07C 211/54 564/426 |
| 2006/0289882 A1 | 12/2006 | Nishimura et al. | |
| 2007/0018571 A1 | 1/2007 | Hwang et al. | |
| 2011/0297924 A1 | 12/2011 | Yabunouchi et al. | |
| 2016/0035983 A1 | 2/2016 | Kathirgamanathan | |
| 2021/0328156 A1* | 10/2021 | Maeda | H10K 85/623 |

FOREIGN PATENT DOCUMENTS

| | | |
|---|---|---|
| CN | 1575070 A | 2/2005 |
| CN | 1911898 A | 2/2007 |
| CN | 102325751 A | 1/2012 |
| CN | 105189475 A | 12/2015 |
| CN | 110845393 A | 2/2020 |

OTHER PUBLICATIONS

Homo-Lumo Energy Gap, Schrodinger Education pp. 1-21, Nov. 23, 2022.*
Lavanya et al., DFT Calculations on Molecular Structure, Homo Lumo Study Reactivity Descriptors of Triazine Derivative, International Research Journal of Education and Technology, vol. 05, Issue 04, pp. 49-52, Apr. 2023.*

* cited by examiner

*Primary Examiner* — Alexander C Kollias
(74) *Attorney, Agent, or Firm* — Ling Wu; Stephen Yang; Ling and Yang Intellectual Property

(57) ABSTRACT

An organic light emitting device and a display apparatus are provided. The organic light emitting device includes an anode, a cathode and a light-emitting layer arranged between the anode and the cathode, wherein a doped structure layer is arranged between the anode and the light-emitting layer, the doped structure layer comprises a host material and a guest material doped in the host material, and the host material and the guest material satisfy:

−1.5 eV<|LUMO(*A*)|−|HOMO(*B*)|<1.5 eV;

LUMO(A) is the lowest unoccupied molecular orbit (LUMO) energy level of the host material, and HOMO(B) is the highest occupied molecular orbit (HOMO) energy level of the guest material.

11 Claims, 3 Drawing Sheets

ORGANIC LIGHT EMITTING DEVICE AND DISPLAY APPARATUS

TECHNICAL FIELD

The present disclosure relates to, but is not limited to, the technical field of display, in particular to an organic light emitting device and a display apparatus.

BACKGROUND

Organic Light Emitting Device (OLED) is an active light-emitting device, which has the advantages of light emission, ultra-thin, wide viewing angle, high brightness, high contrast, low power consumption, high reaction speed and so on, and has gradually become the next generation display technology with great development prospects.

OLED includes an anode, a cathode and a light-emitting layer arranged between the anode and the cathode. Its light-emitting principle is that holes and electrons are injected into the light-emitting layer from the anode and the cathode respectively. When the electrons and holes meet in the light-emitting layer, the electrons and holes recombine to generate excitons, and these excitons emit light while changing from excited state to ground state. In order to inject electrons and holes smoothly from the electrode to the light-emitting layer at a lower driving voltage, a hole injection layer and a hole transport layer are arranged between the anode and the light-emitting layer, and an electron injection layer and an electron transport layer are arranged between the cathode and the light-emitting layer. In order to make OLED achieve better light-emitting efficiency and realize low voltage and long life, the design of the hole injection layer is more important.

SUMMARY

The following is a summary of subject matter described in detail herein. This summary is not intended to limit the protection scope of the claims.

An organic light emitting device includes an anode, a cathode and a light-emitting layer arranged between the anode and the cathode, wherein a doped structure layer is arranged between the anode and the light-emitting layer, the doped structure layer includes a host material and a guest material doped in the host material, and the host material and the guest material satisfy:

$-1.5\ eV<|LUMO(A)|-|HOMO(B)|<1.5\ eV.$

LUMO(A) is the lowest unoccupied molecular orbit of the host material, and HOMO(B) is the highest occupied molecular orbit of the guest material.

In an exemplary embodiment, the guest material further satisfies:

$5\ eV \le |HOMO(B)| \le 6.5\ eV.$

In an exemplary embodiment, the host material further satisfies:

$|HOMO(A)| \ge 6\ eV, |LUMO(A)| \ge 4\ eV.$

HOMO(A) is the highest occupied molecular orbit (HOMO) energy level of the host material.

In an exemplary embodiment, a doping ratio of the guest material to the doped structure layer is 0.1% to 40%.

In an exemplary embodiment, one of the host material and the guest material includes a ketone compound and the other includes an aromatic amine compound.

In an exemplary embodiment, the guest material includes, but is not limited to, a compound having a structure of formula (I):

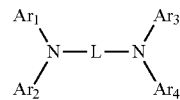

Formula (I)

In formula (I), $Ar_1$ to $Ar_4$ are each independently a substituted or unsubstituted aryl group having 5 to 50 ring atoms, L is a connecting group formed by a substituted or unsubstituted arylene group having 5 to 50 ring atoms, or a connecting group obtained by connecting a plurality of substituted or unsubstituted arylene groups having 5 to 50 ring atoms with M1, wherein M1 is any one of single bond, oxygen atom, sulfur atom, nitrogen atom, and saturated or unsaturated divalent aliphatic hydrocarbon group having 1 to 20 carbon atoms.

In an exemplary embodiment, at least one of $Ar_1$ to $Ar_4$ is selected from any one of the following structures:

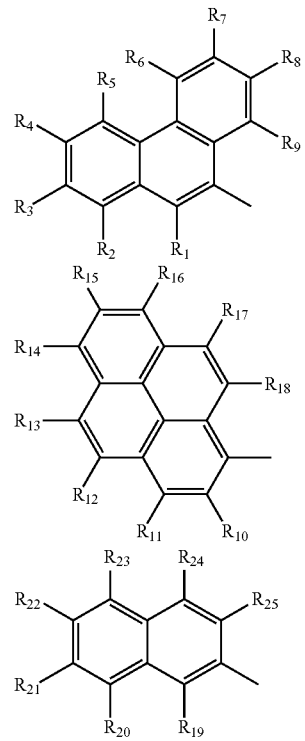

R1 to R25 are each independently any one of hydrogen atom, aryl group having 5 to 50 ring atoms, substituted or unsubstituted alkyl group having 1 to 50 carbon atoms, substituted or unsubstituted alkoxy group having 1 to 50 carbon atoms, substituted or unsubstituted aralkyl group having 6 to 50 ring atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, and aryl group having 5 to 50 ring atoms substituted by M2, wherein M2 is amino, halogen atom, cyano, nitro, hydroxyl or carboxyl.

In an exemplary embodiment, the host material includes, but is not limited to, a compound having a structure of formula (II):

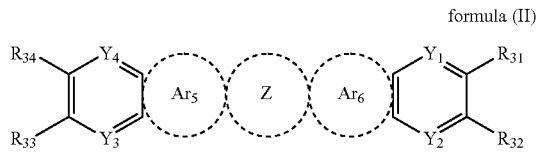

formula (II)

In formula (II), Z is a substituted or unsubstituted benzene ring, pyridine ring, thiophene ring, quinoline, indole or thienothiophene ring.

$Ar_5$ is

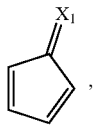

$Ar_6$ is

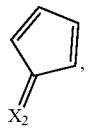

$Y_1$ to $Y_4$ are each independently N or C—R35.

R31 to R35 are each independently selected from any one of hydrogen, deuterium, halogen group, nitrile group, substituted or unsubstituted alkyl group, substituted or unsubstituted haloalkyl group, substituted or unsubstituted alkoxy group, substituted or unsubstituted haloalkoxy group, substituted or unsubstituted aryl group, substituted or unsubstituted halogenated aryl group, substituted or unsubstituted silyl group and substituted or unsubstituted heterocycle.

X1 and X2 are each independently selected from any one of the following structures:

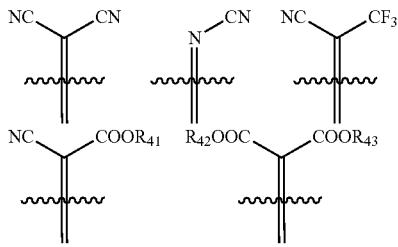

R41 to R43 are each independently any one of hydrogen, fluoroalkyl, alkyl, aryl and heterocyclic group, and R42 and R43 form a ring.

In an exemplary embodiment, the doped structure layer includes a hole injection layer.

In an exemplary embodiment, a doping ratio of the guest material to the hole injection layer is 0.5% to 30%.

In an exemplary embodiment, the hole injection layer has a thickness of 1 nm to 10 nm.

In an exemplary embodiment, at least one organic layer is further arranged between the hole injection layer and the light-emitting layer, a carrier mobility in the at least one organic layer is $10^{-3}$ $cm^2/Vs$ to $10^{-5}$ $cm^2/Vs$, and/or a conductivity of the at least one organic layer is less than or equal to that of the hole injection layer.

In an exemplary embodiment, the material of the at least one organic layer is the same as that of the guest material.

In an exemplary embodiment, the at least one organic layer is a hole transport layer, and a material of the hole transport layer satisfies:

$$5\ eV \leq |HOMO(D)| \leq 6.5\ eV.$$

HOMO(D) is the highest occupied molecular orbit (HOMO) energy level of the hole transport layer.

In an exemplary embodiment, two organic layers are further arranged between the hole injection layer and the light-emitting layer, a carrier mobility in the two organic layers is $10^{-3}$ $cm^2/Vs$ to $10^{-5}$ $cm^2/Vs$, and/or a conductivity of the two organic layers is less than or equal to that of the hole injection layer.

A display apparatus includes the aforementioned organic light emitting device.

In an exemplary embodiment, the display apparatus includes a substrate and a plurality of sub-pixels formed on the substrate, and the sub-pixels include the organic light emitting device. An orthographic projection of the hole injection layer on the substrate overlaps with an orthographic projection of a light-emitting area of at least two sub-pixels on the substrate.

In an exemplary embodiment, an area of the hole injection layer is larger than that of the light-emitting layer.

In an exemplary embodiment, the sub-pixel further includes a pixel driving circuit. An orthographic projection of the light-emitting layer of at least part of the sub-pixels on the substrate overlaps with an orthographic projection of a driving transistor of the pixel driving circuit on the substrate.

Other aspects will become apparent upon reading and understanding accompanying drawings and the detailed description.

BRIEF DESCRIPTION OF DRAWINGS

The attached drawings are used to provide a further understanding of the technical scheme of the present disclosure, and constitute a part of the specification. They are used together with the embodiments of the present application to explain the technical scheme of the present disclosure, and do not constitute a restriction on the technical scheme of the present disclosure. Shapes and sizes of the components in the drawings do not reflect true proportions and only to be used to schematically illustrate contents of the present disclosure.

REFERENCE SIGNS

Figure 1:
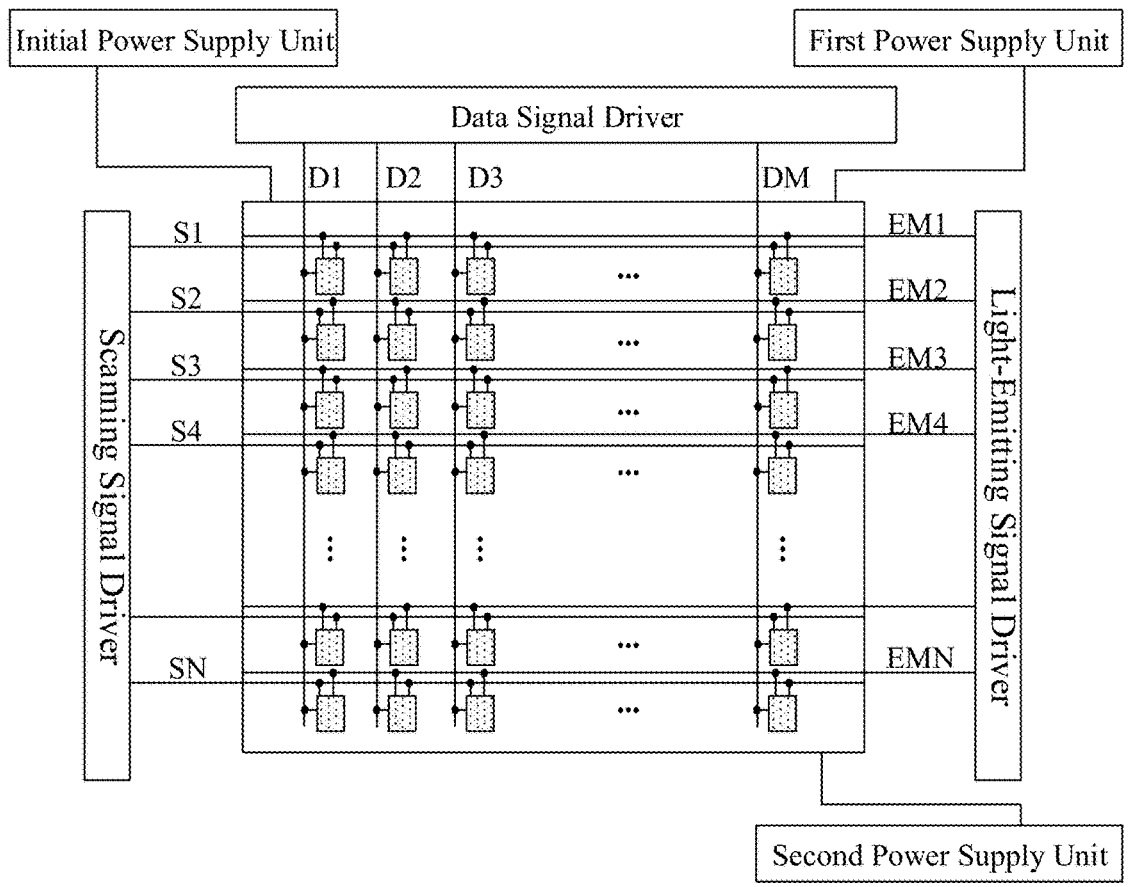
FIG. 1 is a schematic structural diagram of an OLED display apparatus.

10—anode; 20—hole injection layer; 30—hole transport layer;
40—electron block layer; 50—light-emitting layer; 60—hole block layer;
70—electron transport layer; 80—electron injection layer; 90—cathode;
101—substrate; 102—driving circuit layer; 103—light-emitting device;
104—encapsulation layer; 201—first insulating layer; 202—second insulating layer;
203—third insulating layer; 204—fourth insulating layer; 205—flat layer;
210—driving transistor; 211—storage capacitor; 301—anode;
303—organic light-emitting
302—pixel defining layer; 304—cathode; layer;
402—second encapsulation
401—first encapsulation layer; 403—third encapsulation layer. layer;

DETAILED DESCRIPTION

The embodiments herein may be implemented in a number of different ways. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments and features in the embodiments in the present disclosure may be combined randomly if there is no conflict.

In the drawings, a size of a constituent element, a thickness of a layer or an area of the layer may be sometimes exaggerated for clarity. Therefore, any implementation mode of the present disclosure is not necessarily limited to a size shown in the drawings, and the shapes and sizes of the components in the drawings do not reflect true proportions. In addition, the drawings schematically show ideal examples, and any implementation mode of the present disclosure is not limited to the shapes or values shown in the drawings.

In the present disclosure, the "first", "second", "third" and other ordinal numbers are used to avoid confusion of constituent elements, but not to limit in quantity.

In the present disclosure, for sake of convenience, wordings such as "central", "upper", "lower", "front", "rear", "vertical", "horizontal", "top", "bottom", "inner", "outer" and the like describe the orientations or positional relations of constituent elements with reference to the drawings, which are only for ease of description of this specification and for simplification of the description, rather than indicating or implying that the apparatus or element referred to must have a specific orientation, or must be constructed and operated in a particular orientation, and therefore cannot be construed as limitations on the present disclosure. The positional relations of the constituent elements may be appropriately changed according to the direction in which each constituent element is described. Therefore, they are not limited to the wordings in the present disclosure, and may be replaced appropriately according to the situations.

In the present disclosure, the terms "installed", "connected" and "coupled" shall be broadly understood unless otherwise explicitly specified and defined. For example, a connection may be a fixed connection, or may be a detachable connection, or an integrated connection; it may be a mechanical connection, or may be an electrical connection; it may be a direct connection, or may be an indirect connection through middleware, or may be an internal connection between two elements. Those of ordinary skills in the art can understand the specific meanings of the above mentioned terms in the present disclosure according to specific context.

In the present disclosure, a transistor refers to an element that includes at least three terminals: a gate electrode, a drain electrode, and a source electrode. The transistor has a channel region between the drain electrode (or referred to as a drain electrode terminal, a drain region or a drain electrode) and the source electrode (or referred to as a source electrode terminal, a source region or a source electrode), and a current can flow through the drain electrode, the channel region and the source electrode. In the present disclosure, the channel region refers to a region through which a current mainly flows.

In the present disclosure, the first electrode may be a drain electrode and the second electrode may be a source electrode, or the first electrode may be a source electrode and the second electrode may be a drain electrode. In a situation where transistors with opposite polarities are used or a current direction is changed in an operation of a circuit, a function of the "source electrode" and a function of the "drain electrode" can sometimes be interchangeable. Therefore, the "source electrode" and the "drain electrode" can be interchangeable in the present disclosure.

In the present disclosure, an "electrical connection" includes a case where constituent elements are connected via an element having a certain electrical action. The "element having a certain electrical action" is not particularly limited as long as it can transmit and receive electrical signals between connected constituent elements. An "element with a certain electrical action" may be, for example, an electrode or wiring, a switching element such as a transistor, or other functional elements such as a resistor, an inductor or a capacitor, etc.

Herein, "parallel" refers to a state in which two straight lines form an angle of −10 degrees or more and 10 degrees or less, and thus also includes a state in which the angle is −5 degrees or more and 5 degrees or less. In addition, "vertical" refers to a state in which two straight lines form an angle between 80 degrees and 100 degrees and thus, includes a state in which the angle is between 85 and 95 degrees.

In the present disclosure, a "film" and a "layer" are interchangeable. For example, sometimes "conductive layer" may be replaced by "conductive film". Similarly, "insulating film" may sometimes be replaced by "insulating layer".

The term "about" herein means that the limit is not strictly set, and a value within the range of process and measurement errors is allowed.

FIG. 1 is a schematic structural diagram of an OLED display apparatus. As shown in FIG. 1, the OLED display apparatus may include a scanning signal driver, a data signal driver, a light-emitting signal driver, an OLED display panel, a first power supply unit, a second power supply unit and an initial power supply unit. In an exemplary embodiment, the OLED display substrate at least includes a plurality of scanning signal lines (S1 to SN), a plurality of data signal lines (D1 to DM) and a plurality of light-emitting signal lines (EM1 to EMN). The scanning signal driver is configured to sequentially supply scanning signals to the plurality of scanning signal lines (S1 to SN), the data signal driver is configured to supply data signals to the plurality of data signal lines (D1 to DM), and the light-emitting signal driver is configured to sequentially supply light-emitting control signals to the plurality of light-emitting signal lines (EM1 to EMN). In an exemplary embodiment, the plurality of scanning signal lines and the plurality of light-emitting signal lines extend along a horizontal direction, and the plurality of data signal lines extend along a vertical direction. The display apparatus includes a plurality of sub-pixels, and one sub-pixel is connected with a scanning signal line, a light-emitting control line and a data signal line, for example. The first power supply unit, the second power supply unit and the initial power supply unit are configured to supply a first power supply voltage, a second power supply voltage and an initial power supply voltage to a pixel circuit through a first power supply line, a second power supply line and an initial signal line, respectively.

Figure 2:
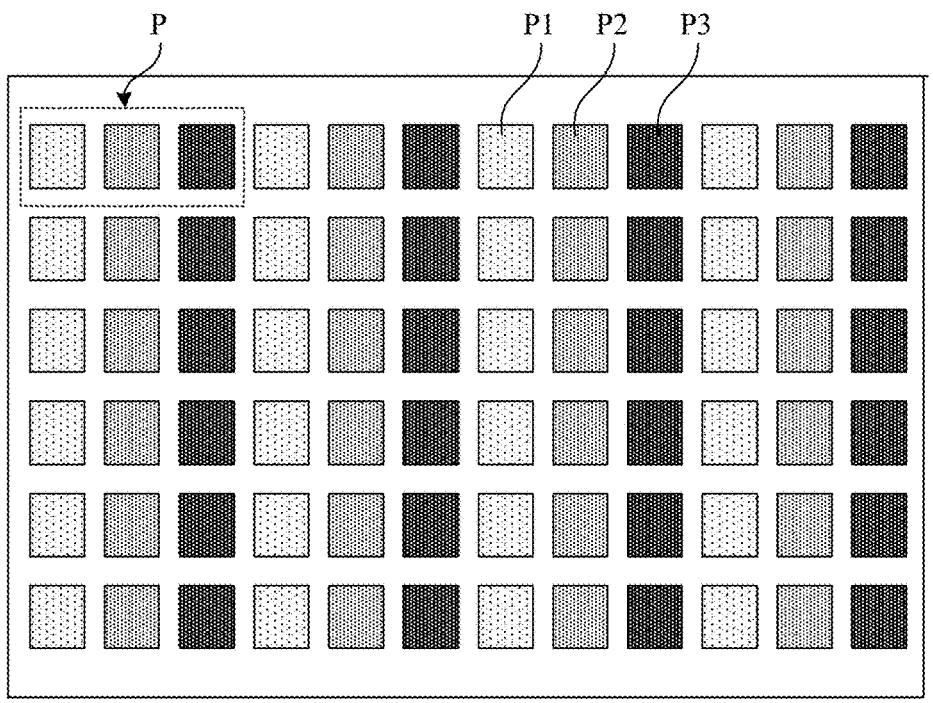
FIG. 2 is a schematic plan view of a display area of a display substrate.

FIG. 2 is a schematic plan view of a display area of a display substrate. As shown in FIG. 2, the display area may include a plurality of pixel units P arranged in a matrix, at least one of which includes a first sub-pixel P1 emitting light of a first color, a second sub-pixel P2 emitting light of a second color, and a third sub-pixel P3 emitting light of a third color. The first sub-pixel P1, the second sub-pixel P2, and the third sub-pixel P3 each include a pixel driving circuit and a light-emitting device. The pixel driving circuits in the first sub-pixel P1, the second sub-pixel P2, and the third sub-pixel P3 are respectively connected with the scanning signal line, the data signal line and the light-emitting signal line. The pixel driving circuit is configured to receive a data voltage transmitted by the data signal line and output a corresponding current to the light-emitting device under a control of the scanning signal line and the light-emitting signal line. The light-emitting devices in the first sub-pixel P1, the second sub-pixel P2 and the third sub-pixel P3 are respectively connected with the pixel driving circuits of the sub-pixels where the light-emitting devices are located. The light-emitting device is configured to emit light with a corresponding brightness in response to a current output by the pixel driving circuit of the sub-pixel where the light-emitting device is located.

In an exemplary embodiment, the pixel unit p may include red (R), green (G) and blue (B) sub-pixels, or may include red, green, blue and white (W) sub-pixels, which is not limited in the present disclosure. In an exemplary embodiment, a shape of the sub-pixel in the pixel unit may be rectangular, diamond, pentagonal or hexagonal. When the pixel unit includes three sub-pixels, the three sub-pixels may be arranged in a manner to stand side by side horizontally, in a manner to stand side by side vertically, or in a pyramid manner with two units sitting at the bottom and one unit placed on top. When the pixel unit includes four sub-pixels, the four sub-pixels may be arranged in a manner to stand side by side horizontally, in a manner to stand side by side vertically, or in a manner to form a square, which is not specifically limited in the present disclosure.

Figure 3:
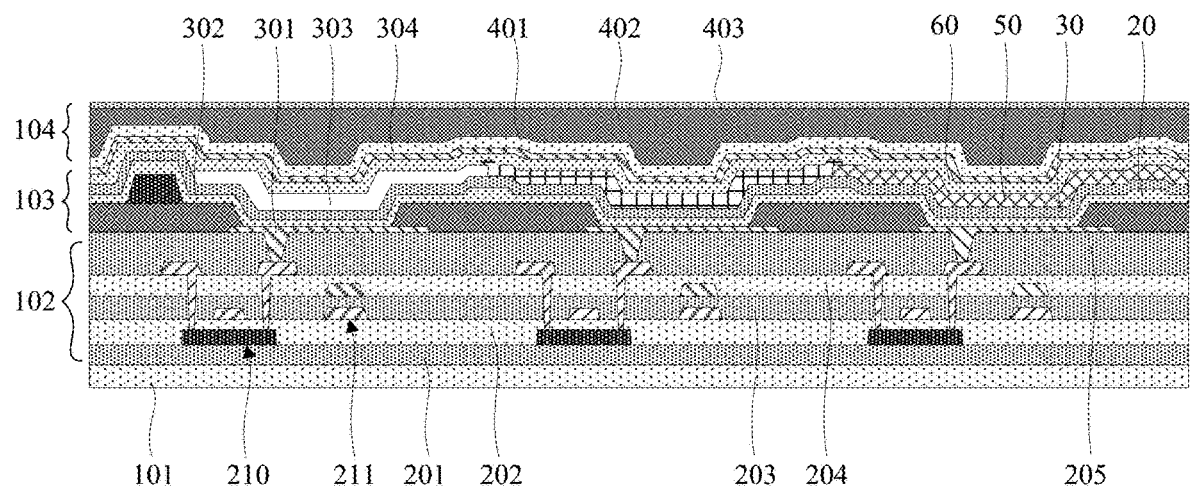
FIG. 3 is a schematic sectional view of a display substrate.

FIG. 3 is a schematic sectional view of a display substrate, showing a structure of three sub-pixels in an OLED display substrate. As shown in FIG. 3, on a plane perpendicular to the display substrate, the display substrate may include a driving circuit layer 102 arranged on a substrate 101, a light-emitting device 103 arranged on a side of the driving circuit layer 102 away from the substrate 101, and an encapsulation layer 104 arranged on a side of the light-emitting device 103 away from the substrate 101. In some possible implementations, the display substrate may include other film layers, such as spacer posts, etc., which is not limited in the present disclosure.

In an exemplary implementation, the substrate may be a flexible substrate or may be a rigid substrate. The flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the driving circuit layer 102 of each sub-pixel may include a plurality of transistors and a storage capacitor constituting a pixel driving circuit, an example of which is illustrated in FIG. 3 where each sub-pixel includes a driving transistor and a storage capacitor. In some possible implementations, the driving circuit layer 102 of each sub-pixel may include: a first insulating layer 201 arranged on the substrate; an active layer arranged on the first insulating layer; a second insulating layer 202 covering the active layer; a gate electrode and a first capacitor electrode arranged on the second insulating layer 202; a third insulating layer 203 covering the gate electrode and the first capacitor electrode; a second capacitor electrode arranged on the third insulating layer 203; a fourth insulating layer 204 covering the second capacitor electrode, wherein the second insulating layer 202, the third insulating layer 203 and the fourth insulating layer 204 are provided with via holes exposing the active layer; a source electrode and a drain electrode arranged on the fourth insulating layer 204, wherein the source electrode and the drain electrode are respectively connected with the active layer through via holes; and a flat layer 205 covering the aforementioned structure, wherein the flat layer 205 is provided with a via hole exposing the drain electrode. The active layer, the gate electrode, the source electrode and the drain electrode constitute a driving transistor 210, and the first capacitor electrode and the second capacitor electrode constitute a storage capacitor 211.

In an exemplary embodiment, the light-emitting device 103 may include an anode 301, a pixel defining layer 302, an organic light-emitting layer 303 and a cathode 304. The anode 301 is arranged on the flat layer 205, and is connected with the drain electrode of the driving transistor 210 through a via hole formed in the flat layer 205. The pixel defining layer 302 is arranged on the anode 301 and the flat layer 205, and the pixel defining layer 302 is provided with a pixel opening exposing the anode 301. The organic light-emitting layer 303 is at least partially arranged in the pixel opening, and the organic light-emitting layer 303 is connected with the anode 301. The cathode 304 is arranged on the organic light-emitting layer 303 and connected with the organic light-emitting layer 303. The organic light-emitting layer 303 emits light of a corresponding color driven by the anode 301 and the cathode 304.

In an exemplary embodiment, the encapsulation layer 104 may include a first encapsulation layer 401, a second encapsulation layer 402 and a third encapsulation layer 403 which are stacked. The first encapsulation layer 401 and the third encapsulation layer 403 may be made of an inorganic material, and the second encapsulation layer 402 may be made of an organic material. The second encapsulation layer 402 is arranged between the first encapsulation layer 401 and the third encapsulation layer 403 to ensure that external moisture is unable to enter the light-emitting device 103.

In an exemplary embodiment, the organic light-emitting layer 303 may at least include a hole injection layer 20, a hole transport layer 30, a light-emitting layer 50 and a hole block layer 60 which are stacked on the anode 301. In an exemplary embodiment, the hole injection layer 20 of all sub-pixels is a common layer connected together. The hole transport layer 30 of all sub-pixels is a common layer connected together. The light-emitting layers 50 of adjacent sub-pixels may overlap in a small portion or be isolated. The hole block layer 60 is a common layer connected together.

Figure 4:
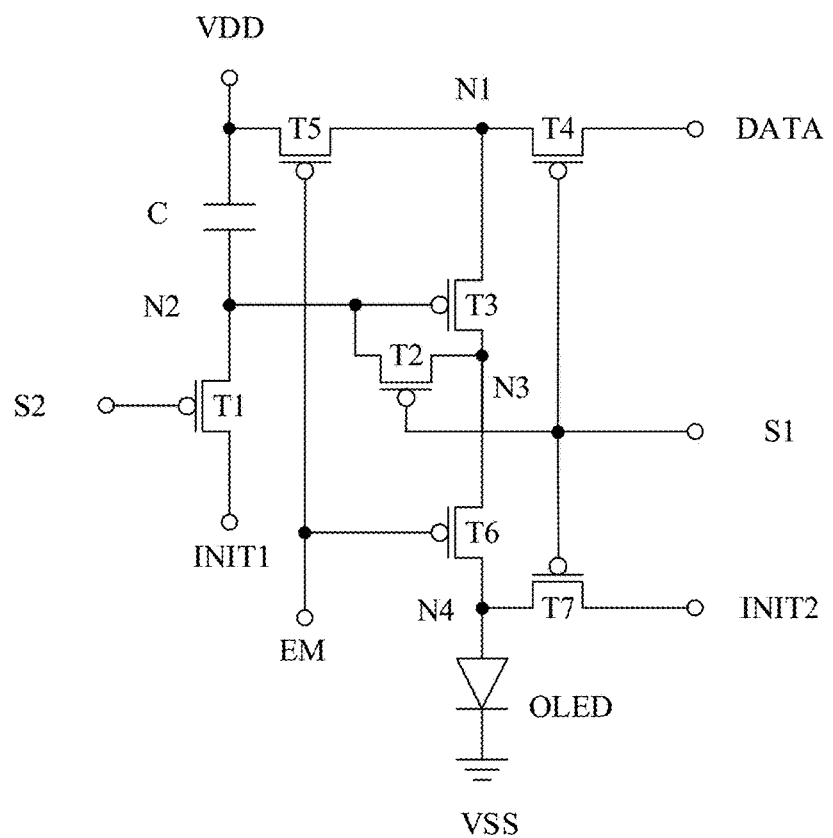
FIG. 4 is an equivalent circuit diagram of a pixel driving circuit.

In an exemplary implementation, the pixel driving circuit may have a structure of 3T1C, 4T1C, 5T1C, 5T2C, 6T1C or 7T1C. FIG. 4 is an equivalent circuit diagram of a pixel driving circuit. As shown in FIG. 4, the pixel driving circuit may include seven switching transistors (a first transistor T1 to a seventh transistor T7), a storage capacitor C and eight signal lines (a data signal line DATA, a first scanning signal line S1, a second scanning signal line S2, a first initial signal line INIT1, a second initial signal line INIT2, a first power supply line VSS, a second power supply line VDD and a light-emitting signal line EM).

In an exemplary implementation, a control electrode of the first transistor T1 is connected with the second scanning signal line S2, a first electrode of the first transistor T1 is connected with the first initial signal line INIT1, and a second electrode of the first transistor is connected with a second node N2. A control electrode of the second transistor T2 is connected with the first scanning signal line S1, a first electrode of the second transistor T2 is connected with the second node N2, and a second electrode of the second transistor T2 is connected with a third node N3. A control electrode of the third transistor T3 is connected with the second node N2, a first electrode of the third transistor T3 is connected with the first node N1, and a second electrode of the third transistor T3 is connected with the third node N3. A control electrode of the fourth transistor T4 is connected with the first scanning signal line S 1, a first electrode of the fourth transistor T4 is connected with the data signal line DATA, and a second electrode of the fourth transistor T4 is connected with the first node N1. A control electrode of the fifth transistor T5 is connected with the light-emitting signal line EM, a first electrode of the fifth transistor T5 is connected with the second power supply line VDD, and a second electrode of the fifth transistor T5 is connected with the first node N1. A control electrode of the sixth transistor T6 is connected with the light emitting signal line EM, a first electrode of the sixth transistor T6 is connected with the third node N3, and a second electrode of the sixth transistor T6 is connected with a first electrode of the light-emitting device. A control electrode of the seventh transistor T7 is connected with the first scanning signal line S1, a first electrode of the seventh transistor T7 is connected with the second initial signal line INIT2, and a second electrode of the seventh transistor T7 is connected with the first electrode of the light-emitting device. A first end of the storage capacitor C is connected with the second power supply line VDD, and a second end of the storage capacitor C is connected with the second node N2.

In an exemplary implementation, the first transistor T1 to the seventh transistor T7 may be P-type transistors or may be N-type transistors. Adopting transistors of the same type in the pixel driving circuit may simplify a process flow, reduce difficulty in a preparation process of the display panel, and improve a product yield rate. In some possible implementations, the first transistor T1 to the seventh transistor T7 may include P-type transistors and N-type transistors.

In an exemplary implementation, a second electrode of the light-emitting device is connected with the first power supply line VSS. A signal on the first power supply line VSS is a low level signal, and a signal on the second power supply line VDD is a high level signal that is continuously supplied. The first scanning signal line S1 is a scanning signal line for a pixel driving circuit of a current display row, and the second scanning signal line S2 is a scanning signal line for a pixel driving circuit of a previous display row. That is, for an nth display row, the first scanning signal line S1 is S(n), the second scanning signal line S2 is S(n−1), the second scanning signal line S2 of the current display row and the first scanning signal line S1 for the pixel driving circuit of the previous display row are the same signal line, which may reduce the signal lines of the display panel and realize the narrow frame of the display panel.

In an exemplary embodiment, the organic light-emitting layer of the OLED light-emitting element may include an Emitting Layer (EML), and one or more film layers selected from a Hole Injection Layer (HIL), a Hole Transport Layer (HTL), a Hole Block Layer (HBL), an Electron Block Layer (EBL), an Electron Injection Layer (EIL) and an Electron Transport Layer (ETL). Driven by the voltage of the anode and the cathode, light is emitted using the light-emitting characteristics of the organic material according to the required gray scale.

In an exemplary embodiment, the light-emitting layers of OLED light-emitting elements of different colors are different. For example, red light-emitting element includes a red light-emitting layer, green light-emitting element includes a green light-emitting layer, and blue light-emitting element includes a blue light-emitting layer. In order to reduce the process difficulty and improve the yield, a common layer may be used for the hole injection layer and the hole transport layer on one side of the light-emitting layer, and a common layer may be used for the electron injection layer and the electron transport layer on the other side of the light-emitting layer. In an exemplary embodiment, any one or more layers of the hole injection layer, the hole transport layer, the electron injection layer and the electron transport layer may be manufactured by one-time process (one-time evaporation process or one-time ink-jet printing process), but the isolation is realized by means of the height difference of formed film layer or by means of the surface treatment. For example, any one or more layers of the hole injection layer, the hole transport layer, the electron injection layer and the electron transport layer corresponding to adjacent sub-pixels may be isolated. In an exemplary embodiment, the organic light-emitting layer may be formed by evaporation using a Fine Metal Mask (FMM) or an Open Mask, or by ink jet process.

In an OLED structure, the material for the hole injection layer HIL is similar to that for the hole transport layer HTL. The Highest Occupied Molecular Orbit (HOMO) energy level of the material of the hole injection layer is between the anode work function and the HOMO energy level of the material of the hole transport layer, so that the hole injection may be achieved by reducing the potential barrier between the anode and the hole transport layer. Studies have shown that potential barriers still exist between the layers of the structure, and the injection effect is poor.

In another OLED structure, the hole injection layer adopts a doped structure, which includes a host material and a doping material. The doped material is a P-doping material, such as 2,3,5,6-tetrafluoro-7,7',8,8'-tetracyandimethyl (F4-TCNQ). The host material and the doping material are doped according to a certain proportion to form a doped structure. P-doping material is a kind of material with strong electron-withdrawing ability, which lacks electrons and has strong ability to withdraw electrons. Therefore, due to the strong electron-withdrawing ability of the P-doping material, electrons move rapidly toward the anode under the action of electric field, and holes are rapidly transported toward the hole transport layer, thus achieving better hole injection performance. Studies have shown that the p-type doped structure has poor thermal stability and is easy to crystallize, which is not conducive to the preparation. When the doping ratio is greater than 5%, it is easy to cause crosstalk between sub-pixels, resulting in poor display.

In another OLED structure, the hole injection layer is made of a material with strong electron-withdrawing property, which can not only improve the hole injection performance, but also improve the poor display caused by P-type doping. Studies have shown that materials with this property usually have strong molecular polarity, are easy to crystallize, have poor stability and are difficult to process.

An Exemplary embodiment of the present disclosure provides an organic light emitting device, including an anode, a cathode, and a light-emitting layer arranged between the anode and the cathode. The doped structure layer includes a host material and a guest material doped in the host material. The host material and the guest material satisfy:

$-1.5\ eV < |LUMO(A)| - |HOMO(B)| < 1.5\ eV.$

LUMO(A) is the lowest unoccupied molecular orbit (LUMO) energy level of the host material, and HOMO(B) is the highest occupied molecular orbit (HOMO) energy level of the guest material.

In an exemplary embodiment, the doping ratio of the guest material to the doped structure layer is 0.1% to 40%.

In an exemplary embodiment, one of the host material and the guest material includes a ketone compound and the other includes an aromatic amine compound. For example, the host material includes a ketone compound, and the guest material includes an aromatic amine compound.

In an exemplary embodiment, the doped structure layer includes a hole injection layer.

In an exemplary embodiment, a thickness of the hole injection layer is 1 nm to 10 nm.

Figure 5:
FIG. 5 is a schematic diagram of an OLED structure according to an exemplary embodiment of the present disclosure.

FIG. 5 is a schematic diagram of an OLED structure according to an exemplary embodiment of the present disclosure. As shown in FIG. 5, the OLED includes an anode 10, a cathode 90, and an organic light-emitting lay arranged between the anode 10 and the cathode 90. In an exemplary embodiment, the organic light-emitting layer includes a hole injection layer 20, a hole transport layer 30, an electron block layer 40, a light-emitting layer 50, a hole block layer 60, an electron transport layer 70 and an electron injection layer 80 which are stacked. The hole injection layer 20 is configured to lower the potential barrier for injecting holes from the anode, so that the holes may be efficiently injected into the light-emitting layer 50 from the anode. The hole transport layer 30 is configured to realize directional and orderly controlled migration of injected holes. The electron block layer 40 is configured to form a migration barrier for electrons and prevent electrons from migrating out of the light-emitting layer 50. The light-emitting layer 50 is configured to recombine electrons and holes to emit light. The hole block layer 60 is configured to form a migration barrier for holes and prevent holes from migrating out of the light-emitting layer 50. The electron transport layer 70 is configured to realize directional and orderly controlled migration of injected electrons. The electron injection layer 80 is configured to lower the potential barrier of electrons injected from the cathode, so that electrons may be efficiently injected from the cathode into the light-emitting layer 50.

In an exemplary embodiment, the doped structure layer is a hole injection layer 20, which includes a host material A and a guest material B doped in the host material A. The highest occupied molecular orbit (HOMO) energy level and the Lowest Unoccupied Molecular Orbit (LUMO) energy level of the host material A and the guest material B satisfy:

$-1.5\ eV < |LUMO(A)| - |HOMO(B)| < 1.5\ eV.$

LUMO(A) is the lowest unoccupied molecular orbit (LUMO) energy level of the host material A, and HOMO(B) is the highest occupied molecular orbit (HOMO) energy level of the guest material B.

In an exemplary embodiment, the HOMO energy level and the LUMO energy level of the host material A satisfy:

$|HOMO(A)| \geq 6\ eV, |LUMO(A)| \geq 4\ eV.$

HOMO(A) is the highest occupied molecular orbit (HOMO) energy level of the host material A.

In an exemplary embodiment, the HOMO energy level of the guest material B satisfies:

$5\ eV \leq |HOMO(B)| \leq 6.5\ eV.$

In an exemplary embodiment, |LUMO(A)| may be greater than or equal to |HOMO(B)|, or |LUMO(A)| may be less than or equal to |HOMO(B)|.

In an exemplary embodiment, the host material A and the guest material B may be evaporated together by a multi-source evaporation process to form a hole injection layer with a doped structure.

In an exemplary embodiment, the doping ratio of the guest material B to the hole injection layer is about 0.1% to 40%. In an exemplary embodiment of the present disclosure, the doping ratio refers to the ratio of the mass of the guest material to the mass of the hole injection layer, that is, the mass percentage. In an exemplary embodiment, the host material and the guest material are co-evaporated, so that the host material and the guest material are uniformly dispersed in the hole injection layer. The doping ratio may be controlled by controlling the evaporation rate of the guest material or by controlling the evaporation rate ratio of the host material to the guest material.

In some possible implementations, the doping ratio of the guest material B to the hole injection layer may be about 0.5% to 30%.

In some possible implementations, the doping ratio of the guest material B to the hole injection layer may be about 5% to 20%.

In some possible implementations, the doping ratio of the guest material B to the hole injection layer may be about 0.5% to 10%.

In some possible implementations, the doping ratio of the guest material B to the hole injection layer may be about 5% to 10%.

In an exemplary embodiment, a thickness of the hole injection layer 20 is about 1 nm to 10 nm. Since the guest material is doped in the host material, it will affect the properties of the host material to a certain extent. Too thick film will lead to a decrease in service life, while too thin film will affect the film forming property and uniformity, thereby leading to the discontinuity of the film and affecting the injection performance.

In an exemplary embodiment, the guest material B may be made of an aromatic amine compound. Aromatic amine compound is a kind of hole transport material that has high mobility and high stability and is difficult to crystallize.

In an exemplary embodiment, the guest material B includes but is not limited to the structure shown in formula (I):

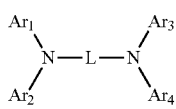

Formula (I)

In formula (I), L is a connecting group formed by a substituted or unsubstituted arylene group having 5 to 50 ring atoms, or a connecting group obtained by connecting a plurality of substituted or unsubstituted arylene groups having 5 to 50 ring atoms with M1, wherein M1 is any one of single bond, oxygen atom, sulfur atom, nitrogen atom, and saturated or unsaturated divalent aliphatic hydrocarbon group having 1 to 20 carbon atoms.

In formula (I), Ar1 to Ar4 may not be completely the same, and are each independently a substituted or unsubstituted aryl having 5 to 50 ring atoms, and at least one of Ar1 to Ar4 is selected from any one of the following structures:

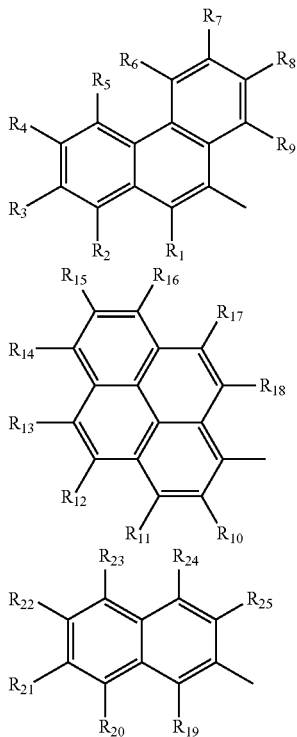

R1 to R25 are each independently any one of:
hydrogen atom, aryl group having 5 to 50 ring atoms, substituted or unsubstituted alkyl group having 1 to 50 carbon atoms, substituted or unsubstituted alkoxy group having 1 to 50 carbon atoms, substituted or unsubstituted aralkyl group having 6 to 50 ring atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, and aryl group having 5 to 50 ring atoms substituted by M2, wherein M2 is amino, halogen atom, cyano, nitro, hydroxyl or carboxyl.

In an exemplary embodiment, the main material A is made of a ketone compound. The ketone compound is a hole injection material with strong electron-withdrawing ability. The strong electron-withdrawing ability is shown as having good electron affinity, which is characterized by HOMO energy level and LUMO energy level.

In an exemplary embodiment, the host material A includes but is not limited to the structure shown in formula (II):

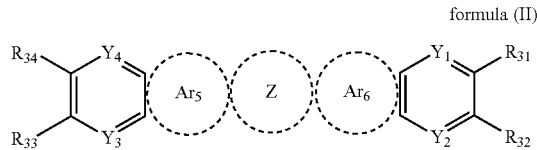

formula (II)

In formula (II), Z may be a substituted or unsubstituted benzene ring, pyridine ring, thiophene ring, quinoline, indole or thienothiophene ring.

$Y_1$ to $Y_4$ may each independently be N or C—R35. $Y_1$ to $Y_4$ may be the same as each other or may be different from each other.

In an exemplary embodiment, R31 to R34 may be the same as or different from each other, and are each independently any one of hydrogen, deuterium, halogen group, nitrile group, substituted or unsubstituted alkyl group, substituted or unsubstituted haloalkyl group, substituted or unsubstituted alkoxy group, substituted or unsubstituted haloalkoxy group, substituted or unsubstituted aryl group, substituted or unsubstituted halogenated aryl group, substituted or unsubstituted silyl group and substituted or unsubstituted heterocycle.

In an exemplary embodiment, R35 may be any one of hydrogen, deuterium, halogen group, nitrile group, substituted or unsubstituted alkyl group, substituted or unsubstituted haloalkyl group, substituted or unsubstituted alkoxy group, substituted or unsubstituted haloalkoxy group, substituted or unsubstituted aryl group, substituted or unsubstituted halogenated aryl group, substituted or unsubstituted silyl group and substituted or unsubstituted heterocycle.

In an exemplary embodiment, $Ar_5$ in formula (II) may be:

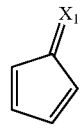

In an exemplary embodiment, $Ar_6$ in formula (II) may be:

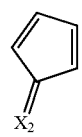

In an exemplary embodiment, X1 and X2 in $Ar_5$ and $Ar_6$ may be the same or may be different.

In an exemplary embodiment, X1 and X2 may each be independently selected from any one of the following structures:

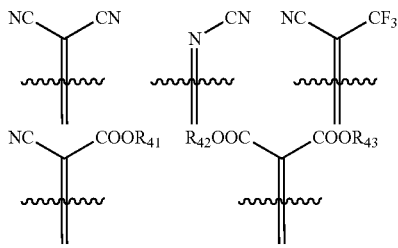

In an exemplary embodiment, R41 to R43 are each hydrogen, fluoroalkyl, alkyl, aryl or heterocyclic group, and R42 and R43 may form a ring.

In an exemplary embodiment, the anode may be made of a material having a high work function. For the bottom emission type, the anode may be made of a transparent oxide material, such as indium tin oxide (ITO) or indium zinc oxide (IZO), and the thickness of the anode may be about 80 nm to 200 nm. For the top emission type, the anode may be made of a composite structure of metal and transparent oxide, such as Ag/ITO, Ag/IZO or ITO/Ag/ITO. The thickness of the metal layer in the anode may be about 80 nm to 100 nm, and the thickness of the transparent oxide in the anode may be about 5 nm to 20 nm, so that the average reflectivity of the anode in the visible region is about 85%-95%.

In an exemplary embodiment, for the top emission OLED, the cathode may be formed by an evaporation process using a metal material. The metal material may be magnesium (Mg), silver (Ag) or aluminum (Al), or alloy material such as Mg:Ag alloy, with the ratio of Mg:Ag being about 3:7 to 1:9. The thickness of the cathode may be about 10 nm to 20 nm sch that the average transmittance of the cathode at a wavelength of 530 nm is about 50%~60%. For the bottom emission OLED, the cathode may be made of magnesium (Mg), silver (Ag), aluminum (Al) or Mg:Ag alloy. The thickness of the cathode may be greater than about 80 nm, so that the cathode 90 has good reflectivity.

In an exemplary embodiment, at least one organic layer is further arranged between the hole injection layer and the light-emitting layer, and the at least one organic layer may be a hole transport layer. In an exemplary embodiment, the hole transport layer may be formed by an evaporation process using a material with high hole mobility, such as carbazole, methylfluorene, spirofluorene, dibenzothiophene or furan. The thickness of the hole transport layer may be about 90 nm to 140 nm, the carrier mobility of the hole transport layer may be about $10^{-3}$ cm²/Vs to $10^{-5}$ cm²/Vs, and the conductivity of the hole transport layer is less than or equal to that of the hole injection layer.

In an exemplary embodiment, the material of the hole transport layer may be the same as the guest material B in the hole injection layer.

In an exemplary embodiment, the HOMO energy level of the material of the hole transport layer satisfies:

$5\ eV \le |HOMO(D)| \le 6.5\ eV.$

HOMO(D) is the highest occupied molecular orbit (HOMO) energy level of the hole transport layer.

In an exemplary embodiment, two organic layers are further arranged between the hole injection layer and the light-emitting layer. The two organic layers may be a hole transport layer and an electron block layer. In an exemplary embodiment, the electron block layer may have a thickness of about 1 nm to 10 nm, and is configured to transfer holes and block electrons and block excitons generated in the light-emitting layer. The conductivity of the electron block layer is less than or equal to that of the hole injection layer.

In an exemplary embodiment, the light-emitting layer may include a light-emitting host material and a light-emitting guest material. The light-emitting host material may be a bipolar single host, or may be a double host formed by blending a hole-type host and an electron-type host. The light-emitting guest material may be a phosphorescent material, a fluorescent material, a delayed fluorescent material and the like. The doping ratio of the light-emitting guest material is about 5% to 15%.

In an exemplary embodiment, the hole block layer has a thickness of about 2 nm to 10 nm and is configured to block holes and excitons generated in the light-emitting layer.

In an exemplary embodiment, the electron transport layer may be made of thiophene, imidazole or azine derivatives by blending with lithium quinoline. The doping ratio of lithium quinoline to the electron transport layer is about 30% to 70%, and the thickness of the electron transport layer may be about 20 nm to 70 nm.

In an exemplary embodiment, the electron injection layer may be formed by an evaporation process using materials such as lithium fluoride (LiF), lithium 8-hydroxyquinoline (LiQ), ytterbium (Yb) or Calcium (ca), and the thickness of the electron injection layer may be about 0.5 nm to 2 nm.

In an exemplary embodiment, the OLED may include an encapsulation layer, which may be encapsulated by frame glue or by thin film.

In an exemplary embodiment, for the top emission OLED, the thickness of the organic light-emitting layer between the anode and the cathode may be designed to meet the optical path requirements of the optical microresonator, so as to obtain the optimal intensity and color of the emitted light.

In an exemplary embodiment, a display substrate including an OLED structure may be formed in the following manner. A driving circuit layer is formed on a substrate through a patterning process, and the driving circuit layer of each sub-pixel may include a driving transistor and a storage capacitor constituting a pixel driving circuit. A flat layer is formed on the substrate on which the aforementioned structure is formed, and a via hole exposing a drain electrode of the driving transistor is formed on a flat layer of each sub-pixel. An anode is formed by a patterning process on the substrate on which the aforementioned structure is formed, and the anode of each sub-pixel is connected with the drain electrode of the driving transistor through the via hole on the flat layer. A pixel defining layer is formed by a patterning process on the substrate on which the aforementioned structure is formed, a pixel opening exposing the anode is formed on the pixel defining layer of each sub-pixel, and each pixel opening serves as a light-emitting area of each sub-pixel. On the substrate on which the aforementioned structure is formed, firstly, an open mask is used to evaporate a hole injection layer, a hole transport layer and an electron block layer in sequence to form a common layer of the hole injection layer, the hole transport layer and the electron block layer on the display substrate. That is, the hole injection layers of all sub-pixels are communicated, the hole transport layers of all sub-pixels are communicated and the electron block layers of all sub-pixels are communicated.

For example, the first hole injection layer, the second hole injection layer, the hole transport layer and the electron block layer have approximately the same area but different thicknesses. Then, a fine metal mask is used to evaporate the red, green and blue light-emitting layers in different sub-pixels, and the light-emitting layers of adjacent sub-pixels may overlap in a small portion (for example, the overlapping portion accounts for less than 10% of the area of the pattern of the respective light-emitting layer), or they may be isolated. Then, a fine metal mask is used to evaporate red, green and blue light-emitting layers in different sub-pixels, and the light-emitting layers of adjacent sub-pixels are isolated. Then, an open mask is used to evaporate the hole block layer, the electron transport layer, the electron injection layer and the cathode in sequence to form a common layer of the hole block layer, the electron transport layer, the electron injection layer and the cathode on the display substrate. That is, the hole block layers of all sub-pixels are communicated, the electron transport layers of all sub-pixels are communicated, and the cathodes of all sub-pixels are communicated.

In an exemplary embodiment, the orthographic projection of one or more of the first hole injection layer, the second hole injection layer, the hole transport layer, the electron block layer, the hole transport layer, the electron injection layer and the cathode on the substrate is continuous. In some examples, at least one of the first hole injection layer, the second hole injection layer, the hole transport layer, the electron block layer, the hole block layer, the electron transport layer, the electron injection layer and the cathode of at least one row or column of the sub-pixels are communicated. In some examples, at least one of the first hole injection layer, the second hole injection layer, the hole transport layer, the electron block layer, the hole block layer, the electron transport layer, the electron injection layer and the cathode of a plurality of sub-pixels are communicated.

In an exemplary embodiment, the organic light-emitting layer may include a microcavity adjusting layer located between the hole transport layer and the light-emitting layer. For example, after the hole transport layer is formed, a fine metal mask may be used to evaporate the red microcavity adjusting layer and the red light-emitting layer, the green microcavity adjusting layer and the green light-emitting layer, and the blue microcavity adjusting layer and the blue light-emitting layer in different sub-pixels.

In an exemplary embodiment, since the hole injection layer is a common layer, the area of the hole injection layer may be approximately the same, and the orthographic projection of the hole injection layer on the substrate at least includes the orthographic projection of the light-emitting areas of two sub-pixels. That is, the orthographic projection of the hole injection layer on the substrate overlaps with the orthographic projection of the light-emitting areas of at least two sub-pixels.

In an exemplary embodiment, since the hole injection layer is a common layer and the light-emitting layers of different sub-pixels are isolated, the orthographic projection of the hole injection layer on the substrate includes the orthographic projection of the light-emitting layer on the substrate, and the area of the hole injection layer is larger than that of the light-emitting layer.

In an exemplary embodiment, the orthographic projection of the light-emitting layer of at least part of the sub-pixels on the substrate overlaps with the orthographic projection of the driving transistor of the pixel driving circuit on the substrate.

Table 1 shows the performance comparison results of different structures of hole injection layer in OLED. The three comparative structures all adopt the structure shown in FIG. 5, the anode is made of ITO and the cathode is made of Mg:Ag alloy. The hole injection layer of structure 1 is a 3% P-type doped structure. The hole injection layer of structure 2 is an undoped structure, including a single host material A. The hole injection layer of structure 3 is a doped structure according to an exemplary embodiment of the present disclosure, which includes host material A and guest material B. LT95 in Table 1 indicates the time for OLED to decrease from initial brightness (100%) to 95% brightness. Since the life curve follows the multi-exponential decay model, the life of OLED may be estimated according to LT95. As shown in Table 1, compared with Structure 1 and Structure 2, Structure 3 has obvious improvement in prolonging the service life, indicating that the hole injection layer with doped structure proposed in the exemplary embodiment of the present disclosure may optimize the crystallinity and stability of materials and improve the service life of devices.

TABLE 1

Performance comparison of different structures of hole injection layer

| Comparative structure | Current density (mA/cm$^2$) | Voltage | Efficiency | Chromaticity coordinate | LT95 |
|---|---|---|---|---|---|
| Structure 1 | 15. | 100% | 100% | (0.135, 0.055) | 100% |
| Device 2 | | 99% | 102% | (0.139, 0.047) | 91% |
| Device 3 | | 98% | 100% | (0.140, 0.046) | 118% |

Table 2 shows the performance comparison results of hole injection layer with different doping ratios in OLED. The three comparative structures all adopt the structure shown in FIG. 5, the anode is made of ITO and the cathode is made of Mg:Ag alloy. The hole injection layer is the doped structure of according to an exemplary embodiment of the present disclosure, which includes host material A and guest material B. The doping ratio of guest material B in structure 4 is 5%, that in structure 5 is 10%, and that in structure 6 is 30%. As shown in Table 2, compared with the hole injection layer made of a single material (Structure 2 in Table 1), different doping ratios may effectively prolong the service life. When the doping ratio of guest material B is 5% and 10%, the voltage and efficiency of the hole injection layer have little change, but the service life is obviously improved, indicating that the doping ratio greater than 5% will not lead to cross-talk between sub-pixels, thus effectively avoiding the problem of low doping ratio of P-type doped structure. When the doping ratio of guest material B is equal to 30%, the service life is increased greatly, but the voltage increases and the efficiency decreases.

TABLE 2

Performance comparison of hole injection layer with different doping ratios

| Comparative structure | doping ratio of B in HIL layer | Current density (mA/cm$^2$) | Voltage | Efficiency | LT95 |
|---|---|---|---|---|---|
| Structure 4 | 5% | 10 | 104% | 98% | 117% |
| Structure 5 | 10% | | 103% | 101% | 112% |
| Structure 6 | 30% | | 112% | 89% | 123% |

Table 3 is another comparison result of OLED according to an exemplary embodiment of the present disclosure. The three comparative structures all adopt the structure shown in FIG. 5, the anode is made of ITO and the cathode is made of Mg:Ag alloy. The hole injection layer is the doped structure of according to an exemplary embodiment of the present disclosure, which includes host material A and guest material B. The thickness of the hole injection layer in structure 7 is 1 nm, that in structure 8 is 5 nm, and that in structure 9 is 10 nm. As shown in Table 3, when the thickness of the hole injection layer is 5 nm, the voltage decreases slightly and the efficiency increases slightly. When the thickness of the hole injection layer is 10 nm, the voltage increases slightly and the efficiency decreases slightly. From the general trend, with the increase in the thickness of the hole injection layer, the voltage and efficiency have no obvious change, but the service life has a certain downward trend. Therefore, a proper thickness of the hole injection layer may be selected according to the collocation of structural layers of the device.

TABLE 3

Performance comparison of hole injection layer with different thicknesses

| Comparative structure | Thickness of HIL layer (nm) | Current density (mA/cm$^2$) | Voltage | Efficiency | LT95 |
|---|---|---|---|---|---|
| Structure 7 | 1 | 10 | 100% | 100% | 100% |
| Structure 8 | 5 | | 97% | 101% | 94% |
| Structure 9 | 10 | | 102% | 99% | 77% |

Figure 6:
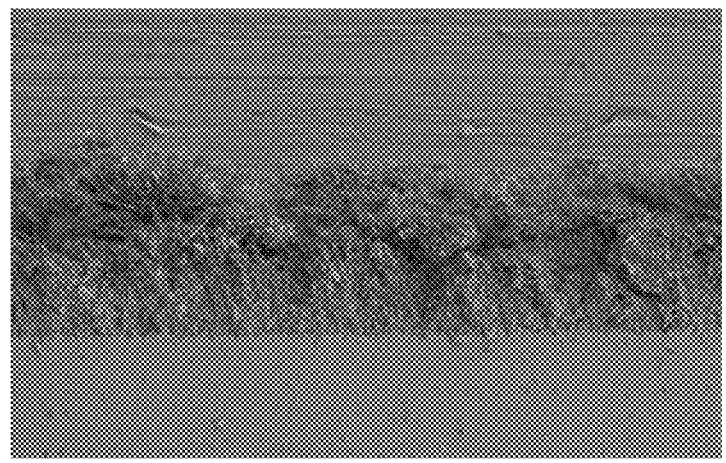
FIG. 6 is an SEM image of an evaporation film layer of a hole injection layer with an undoped structure.
Figure 7:
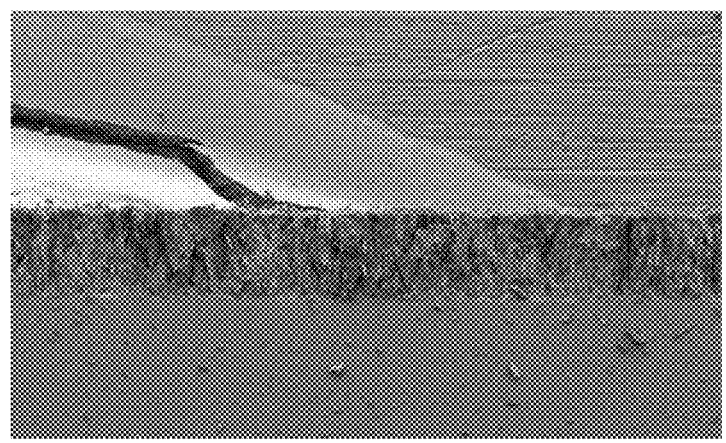
FIG. 7 is an SEM image of an evaporation film layer of a hole injection layer according to an exemplary embodiment of the present disclosure.

FIG. 6 is an SEM image of an evaporation film layer of a hole injection layer with an undoped structure; and FIG. 7 is an SEM image of an evaporation film layer of a hole injection layer according to an exemplary embodiment of the present disclosure. It can be seen from the scanning electron microscope (SEM) images in FIG. 6 and FIG. 7 that the hole injection layer of a single material (undoped structure) is fluffy, while the hole injection layer according to the exemplary embodiment of the present disclosure is denser and smoother, indicating that the optimized doping structure according to the exemplary embodiment of the present disclosure improves the crystallinity and stability of the hole injection layer. The fluffy film layer shown in FIG. 6 may easily cause the blocking phenomenon in the evaporation process, which leads to abnormal sensor activity value in the evaporation equipment, thus causing shutdown of the equipment alarm. The exemplary embodiment of the present disclosure may effectively improve this phenomenon.

An exemplary embodiment of the present disclosure provides an OLED. The hole injection layer adopts a doped structure different from P-type doping, which may effectively improve the crystallinity and thermal stability of the hole injection material, reduce poor evaporation process, realize stable injection performance, effectively reduce the device voltage, and improve the efficiency and service life of the device. Since the doping material is different from the P-doping material, the problem of low doping ratio of the P-type doping structure is avoided, and the larger doping ratio (more than 5%) will not cause crosstalk between sub-pixels, thus effectively improving the display quality. The hole injection layer provided by the exemplary embodiment of the present disclosure has good compatibility in the preparation process, does not increase the evaporation cavity, and can be mass produced.

The present disclosure further provides a display apparatus including the aforementioned organic light emitting device. The display apparatus may be any product or component with a display function such as a mobile phone, a tablet computer, a television, a display, a notebook computer, a digital photo frame, a navigator, a vehicle display, a watch, a bracelets, etc.

Although the embodiments disclosed in the present disclosure are as described above, the described contents are only the embodiments for facilitating understanding of the present disclosure, which are not intended to limit the present disclosure. Any person skilled in the field to which the present application pertains can make any modifications and variations in the forms and details of implementation without departing from the spirit and the scope disclosed in the present application, but the patent protection scope of the present application should still be subject to the scope defined by the appended claims.

What is claimed is:

1. An organic light emitting device, comprising an anode, a cathode and a light-emitting layer arranged between the anode and the cathode, wherein a doped structure layer is arranged between the anode and the light-emitting layer, the doped structure layer comprises a host material and a guest material doped in the host material; the host material and the guest material satisfy:

−1.5 eV<|LUMO(*A*)|−|HOMO(*B*)|<1.5 eV;

where LUMO(A) is the lowest unoccupied molecular orbit (LUMO) energy level of the host material, and HOMO(B) is the highest occupied molecular orbit (HOMO) energy level of the guest material;

wherein one of the host material or the guest material comprises a ketone compound and the other comprises an aromatic amine compound;

wherein the guest material comprises a compound having a structure of formula (I):

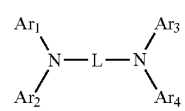

Formula (I)

in formula (I), Ar$_1$ to Ar$_4$ are each independently a substituted or unsubstituted aryl group having 5 to 50 ring atoms, L is a connecting group formed by a substituted or unsubstituted arylene group having 5 to 50 ring atoms, or a connecting group obtained by connecting a plurality of substituted or unsubstituted arylene groups having 5 to 50 ring atoms with M1, wherein M1 is any one of a single bond, an oxygen atom, a sulfur atom, a nitrogen atom or a saturated or unsaturated divalent aliphatic hydrocarbon group having 1 to 20 carbon atoms;

wherein at least one of Ar$_1$ to Ar$_4$ is selected from any one of the following structures:

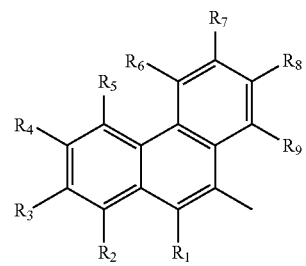

-continued

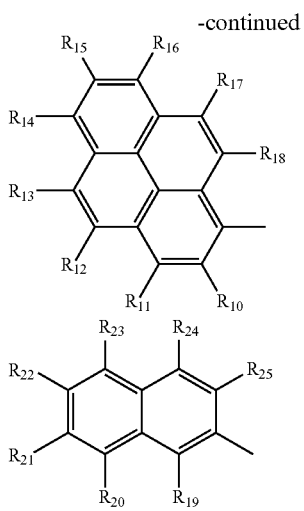

where each of $R_1$ to $R_{18}$ are an aryl group having 5 to 50 ring atoms substituted by a halogen atom, a cyano, a nitro, a hydroxyl or a carboxyl;

where $R_{19}$ to $R_{25}$ are each independently any one of aryl group having 5 to 50 ring atoms, substituted or unsubstituted alkyl group having 1 to 50 carbon atoms, substituted or unsubstituted alkoxy group having 1 to 50 carbon atoms, substituted or unsubstituted aralkyl group having 6 to 50 ring atoms, substituted or unsubstituted aryloxy group having 5 to 50 ring atoms, substituted or unsubstituted arylthio group having 5 to 50 ring atoms, substituted or unsubstituted alkoxycarbonyl group having 1 to 50 carbon atoms, and aryl group having 5 to 50 ring atoms substituted by M2, wherein M2 is amino, halogen atom, cyano, nitro, hydroxyl or carboxyl;

wherein the doped structure layer comprises a hole injection layer, at least one organic layer is further arranged between the hole injection layer and the light-emitting layer, a conductivity of the at least one organic layer is less than or equal to that of the hole injection layer, and a doping ratio of the guest material to the hole injection layer is 5% to 20%.

2. The organic light emitting device according to claim 1, wherein the host material comprises but is not limited to a compound having a structure of formula (II):

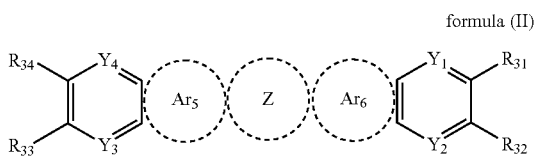

formula (II)

in formula (II), Z is a substituted or unsubstituted benzene ring, pyridine ring, thiophene ring, quinoline, indole or thienothiophene ring;

$Ar_5$ is

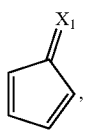

, $Ar_6$ is

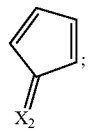

;

$Y_1$ to $Y_4$ are each independently N or C—$R_{35}$;

$R_{31}$ to $R_{35}$ are each independently selected from any one of hydrogen, deuterium, halogen group, nitrile group, substituted or unsubstituted alkyl group, substituted or unsubstituted haloalkyl group, substituted or unsubstituted alkoxy group, substituted or unsubstituted haloalkoxy group, substituted or unsubstituted aryl group, substituted or unsubstituted halogenated aryl group, substituted or unsubstituted silyl group or substituted or unsubstituted heterocycle;

$X_1$ and $X_2$ are each independently selected from any one of the following structures:

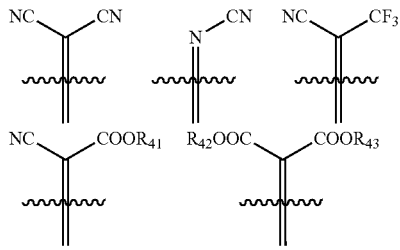

$R_{41}$ to $R_{43}$ are each independently any one of hydrogen, fluoroalkyl, alkyl, aryl or heterocyclic group, and $R_{42}$ and $R_{43}$ form a ring.

3. The organic light emitting device according to claim 1, wherein the hole injection layer has a thickness of 1 nm to 10 nm.

4. The organic light emitting device according to claim 1, wherein a carrier mobility in the at least one organic layer is $10^{-3}$ cm$^2$/Vs to $10^{-5}$ cm$^2$/Vs.

5. The organic light emitting device according to claim 4, wherein a material of the at least one organic layer is the same as that of the guest material.

6. The organic light emitting device according to claim 4, wherein the at least one organic layer is a hole transport layer, and a material of the hole transport layer satisfies:

5 eV≤|HOMO(D)|≤6.5 eV;

where HOMO (D) is the highest occupied molecular orbit (HOMO) energy level of the hole transport layer.

7. The organic light emitting device according to claim 4, wherein two organic layers are further arranged between the hole injection layer and the light-emitting layer, and a carrier mobility in the two organic layers is $10^{-3}$ cm$^2$/Vs to $10^{-5}$ cm$^2$/Vs, and a conductivity of the two organic layers is less than or equal to that of the hole injection layer.

8. A display apparatus comprising the organic light emitting device according to claim 1.

9. The display apparatus according to claim 8, comprising a substrate and a plurality of sub-pixels formed on the substrate, wherein the sub-pixels include the organic light emitting device, and an orthographic projection of the hole injection layer on the substrate overlaps with that of a light-emitting area of at least two sub-pixels on the substrate.

10. The display apparatus according to claim 9, wherein an area of the hole injection layer is larger than that of the light-emitting layer.

11. The display apparatus according to claim 9, wherein the sub-pixel further comprises a pixel driving circuit, and the orthographic projection of the light-emitting layer of at least part of the sub-pixels on the substrate overlaps with an orthographic projection of a driving transistor of the pixel driving circuit on the substrate.

* * * * *